(12) United States Patent
Taguchi (10) Patent No.: US 6,177,814 B1
(45) Date of Patent: Jan. 23, 2001

(54) SEMICONDUCTOR INTEGRATED CIRCUIT DEVICE

(75) Inventor: Toyoki Taguchi, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/404,198

(22) Filed: Sep. 23, 1999

(30) Foreign Application Priority Data

Oct. 28, 1998 (JP) .................................................. 10-307534

(51) Int. Cl.[7] ........................... G01R 19/00; H03K 5/153
(52) U.S. Cl. ................................ 327/58; 327/91; 327/336
(58) Field of Search .................................. 327/58, 59, 60, 327/61, 62, 72, 91, 94, 95, 336, 344

(56) References Cited

U.S. PATENT DOCUMENTS

| | | | |
|---|---|---|---|
| 4,686,432 | * 8/1987 | Berland et al. ....................... | 315/403 |
| 5,025,176 | * 6/1991 | Takeno .................................... | 327/58 |
| 5,250,796 | 10/1993 | Taguchi et al. ....................... | 250/205 |
| 5,394,020 | * 2/1995 | Nienaber .............................. | 327/140 |
| 5,471,169 | * 11/1995 | Dendiger .............................. | 327/563 |

FOREIGN PATENT DOCUMENTS 6-103591   4/1994   (JP) .

* cited by examiner

*Primary Examiner*—Terry D. Cunningham
*Assistant Examiner*—Quan Tra
(74) *Attorney, Agent, or Firm*—Oblon, Spivak, McClelland, Maier & Neustadt, P.C.

(57) ABSTRACT

The present invention provides a peak and bottom detecting circuit including a current source for charging or discharging the capacitor, a switch for connecting the current source to the capacitor, a comparator for comparing a potential of a connection node between the switch and the capacitor, and a potential of an input signal with each other, and for turning the switch on/off in accordance with the result of the comparison, a buffer for buffering the potential of the connection node between the switch and the capacitor, and outputting an output signal, and a damper for comparing the potential of the output signal and the potential of the input signal and reducing the current allowed to flow from the current source as the potential difference becomes smaller.

20 Claims, 5 Drawing Sheets

SEMICONDUCTOR INTEGRATED CIRCUIT DEVICE

BACKGROUND OF THE INVENTION

The present invention relates to a peak/bottom detection circuit for detecting the peak level or bottom level of a laser output, and more specifically, to a peak/bottom detection circuit used for controlling the laser output of an optical head for rewritable optical disks (CD-R, CD-RW, DVD-RAM).

Figure 1:
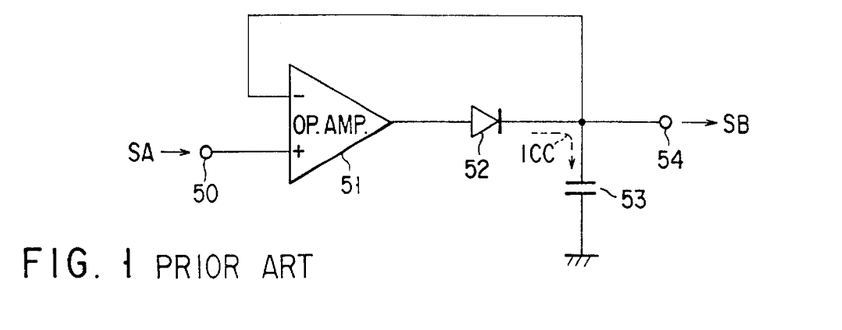
FIG. 1 is a block diagram showing the structure of a conventional peak detection circuit.
Figure 2:
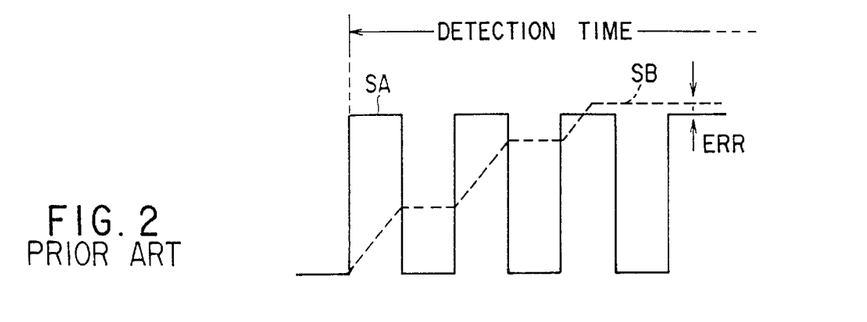
FIG. 2 is a diagram showing a waveform of the operation of the conventional peak detection circuit.

FIG. 1 is a block diagram showing the structure of a conventional peak detection circuit, and FIG. 2 is a diagram showing the waveform of its operation.

As shown in FIG. 1, an input signal SA is supplied to an input terminal 50, and a peak hold signal SB is output from an output terminal 54.

An operation amplifier 51 compares the input signal SA with the peak hold signal SB, and while the input signal SA is being higher than the peak hold signal SB (SA>SB), the output from the operation amplifier 51 is set at "H" level, and the diode 52 is turned on. The diode 52 supplies a charge current ICC to a hold capacitor 53, so as to charge the hold capacitor 53. The level of the peak hold signal SB increases as the hold capacitor 53 is charged as shown in FIG. 2.

Further, when the level of the input signal SA is set to that of the peak hold signal SB or less (SA≦SB), the operation amplifier 51 sets its output to "L" level, and the diode 52 is turned off. Thus, the peak hold signal SB is set in a hold state as shown in FIG. 2.

As the above-described operation is repeated sometimes, the peak hold signal SB is held at substantially the peak level of the input signal SA.

However, in the peak detection circuit shown in FIG. 1, the charge current ICC is not controlled, and therefore it is difficult to finish charging the hold capacitor 53 quickly. Therefore, as can be seen in FIG. 2, the peak hold signal SB, in some cases, exceeds very much the peak level of the input signal SA. This results in a detection error ERR, which greatly decreases the accuracy of the peak detection.

Further, in some other cases, the peak detection is stopped in the middle of its operation, and set in a hold state. In the circuit shown in FIG. 1, it is necessary to switch the input signal SA to the level of the peak hold signal SB or less, in order to execute such a control as just described. This control causes a complexity to the laser output control system or peak detection circuit, which leads to an increase in the product cost.

Further, when the input signal SA is switched, a switching noise is generated. If the peak detection circuit detects the switching noise, a highly accurate peak detection will become further difficult.

BRIEF SUMMARY OF THE INVENTION

The present invention has been proposed in consideration of the above described circumstances, and the main object thereof is to provide a semiconductor integrated circuit device having a peak/bottom detection circuit capable of detecting a peak or a bottom accurately at high speed.

Another object of the present invention is to provide a semiconductor integrated circuit device having a peak/bottom detection signal capable of pausing a peak or bottom detection operation while avoiding an increase in the detection accuracy.

In order to achieve the above-described main object, there is provided according to the present invention, a semiconductor integrated circuit device including a peak/bottom detection circuit having: a capacitor; a current source for charging or discharging the capacitor; a switch for connecting the current source to the capacitor; a comparator for comparing a potential of a connection node between the switch and the capacitor, and a potential of an input signal with each other, and for turning the switch on/off in accordance with a result of the comparison; a buffer for buffering the potential of the connection node between the switch and the capacitor, and outputting an output signal; and a damper for damping the current source on the basis of a result of comparison between a potential of the output signal and a potential of the input signal.

The semiconductor integrated circuit device having the above-described structure includes the damper for damping the current source on the basis of the results of the comparison between the output signal and the input signal. With this structure, it becomes possible to control the charge (discharge) current to the capacitor, which is not conventionally controlled, on the basis of the comparison between the output signal and the input signal. For example, the charge current can be reduced as the difference between the input signal and the output signal becomes smaller.

When the charge current is reduced as the difference between the input signal and the output signal becomes smaller as described above, the charge on the capacitor can be finished at more accurate timing and more quickly than the conventional case where the charge current is not controlled. Therefore, it becomes difficult to cause such a phenomenon that the output signal exceeds the peak level of the input signal, and therefore the accuracy of the peak detection is markedly improved.

Further, in order to achieve the other object of the present invention, a control stage for controlling an output of the comparator and turning off the switch regardless of the result of the comparison of the comparator is further provided.

The semiconductor integrated circuit device having the above-described structure turns off the switch by controlling the output of the comparator. Therefore, the peak or bottom detection can be stopped without controlling the input signal.

As described above, the peak or bottom detection can be stopped without controlling the input signal, and therefore a switch noise is not generated to the input signal when stopping the detection. In this manner, it becomes possible to stop the peak or bottom detection while avoiding the decrease in the detection accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to accompanying drawings.

First Embodiment

Figure 3:
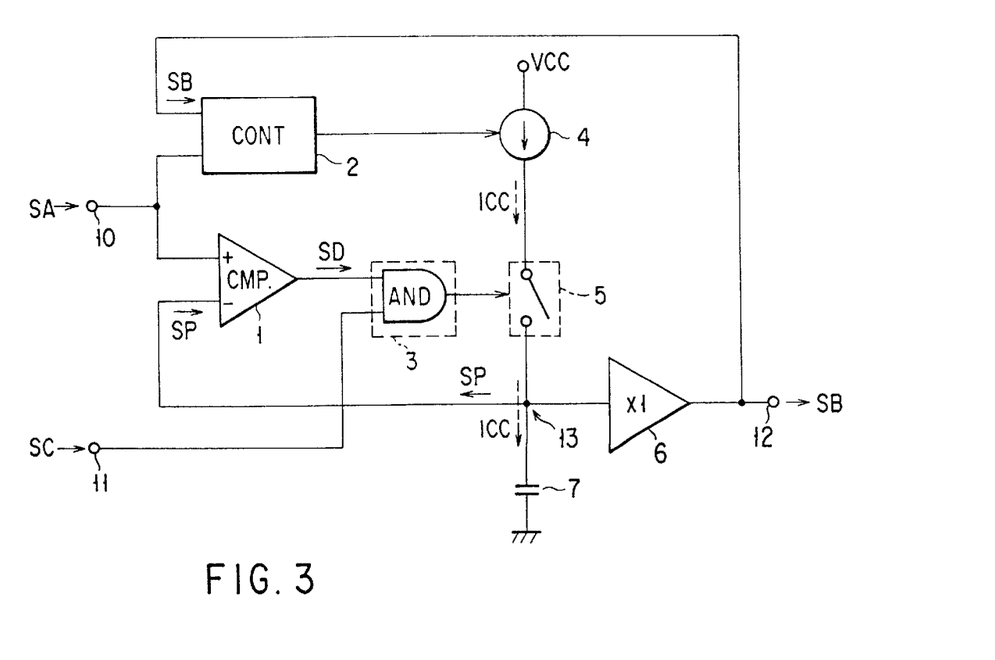
FIG. 3 is a block diagram showing an example of the structure of the peak detection circuit according to the first embodiment of the present invention.

FIG. 3 is a block diagram showing an example of the structure of the peak detection circuit according to the first embodiment of the present invention.

As shown in FIG. 3, an input signal SA is input to an input terminal 10, and a peak hold signal SB is output from an output terminal.

The comparator 1 compares the potential of the input signal SA with the potential of the peak detection output SP, and then outputs a logical signal SD in accordance with the results of the comparison. The comparator 1 outputs a logical signal SD of "H" level, for example, while the potential of the input signal SA is being higher than that of the peak detection output SP (SA>SP). Further, when the potential of the input signal SA becomes equal to or lower than that of the peak detection output SP (SA≦SP), a logical signal SD of "L" level is output. The logical signal SD is supplied to the gate circuit 3.

The gate circuit 3 is a logic circuit which performs logical operations between the signal SD and control signal SC. In this first embodiment, the peak detection operation can be stopped arbitrarily. When the peak detection is stopped, the peak hold signal SB holds the level of the signal at the time where the detection is stopped. The stop of the peak detection is carried out in accordance with the control signal SC. The control signal SC is input to the control terminal 11.

An example of the gate circuit 3 is an AND (logical product) circuit. The gate circuit 3 made of an AND circuit is set in an active state when the control signal SC is at "H" level. In this state, the gate circuit 3 sets an output at "H" level when the logical signal SD is at "H" level, whereas it sets an output at "L" level when the logical signal SD is at "L" level.

The gate circuit 3 made of an AND circuit is set in an inactive state when the control signal SC is at "L" level. In this state, the gate circuit 3 sets an output at "L" level regardless of the level of the logical signal SD. An output from the gate circuit 3 is supplied to a switch 5.

The switch 5 is turned on or off in accordance with the level of the output from the gate circuit 3. For example, when the output from the gate circuit 3 is at "H" level, the switch 5 is turned on. When the switch 5 is turned on, a current source 4 is connected to a hold capacitor 7.

Or, when the output from the gate circuit 3 is at "L" level, the switch 5 is turned off. The switch 5 is turned off, the current source 4 is disconnected from the hold capacitor 7.

A connection node 13 between the switch 5 and the hold capacitor 7 is input to a buffer 6. A peak detection output SP is obtained from the connection node 13.

The buffer 6 buffers a potential at the connection node 13, and outputs it as a peak hold signal SB. The buffer 6 outputs a peak hold signal SB having a potential substantially the same as that of the peak detection output SP.

A damper 2 compares the potential of the input signal SA and that of the peak hold signal SB with each other, and controls the current source 4 in accordance with the result of the comparison. For example, the damper 2 reduces the current (charge current ICC) flown from the current source 4 as the potential difference Δ (SA−SB) between the input signal SA and the peak hold signal SB becomes smaller.

The operation of the damper will now be described.

Figure 4:
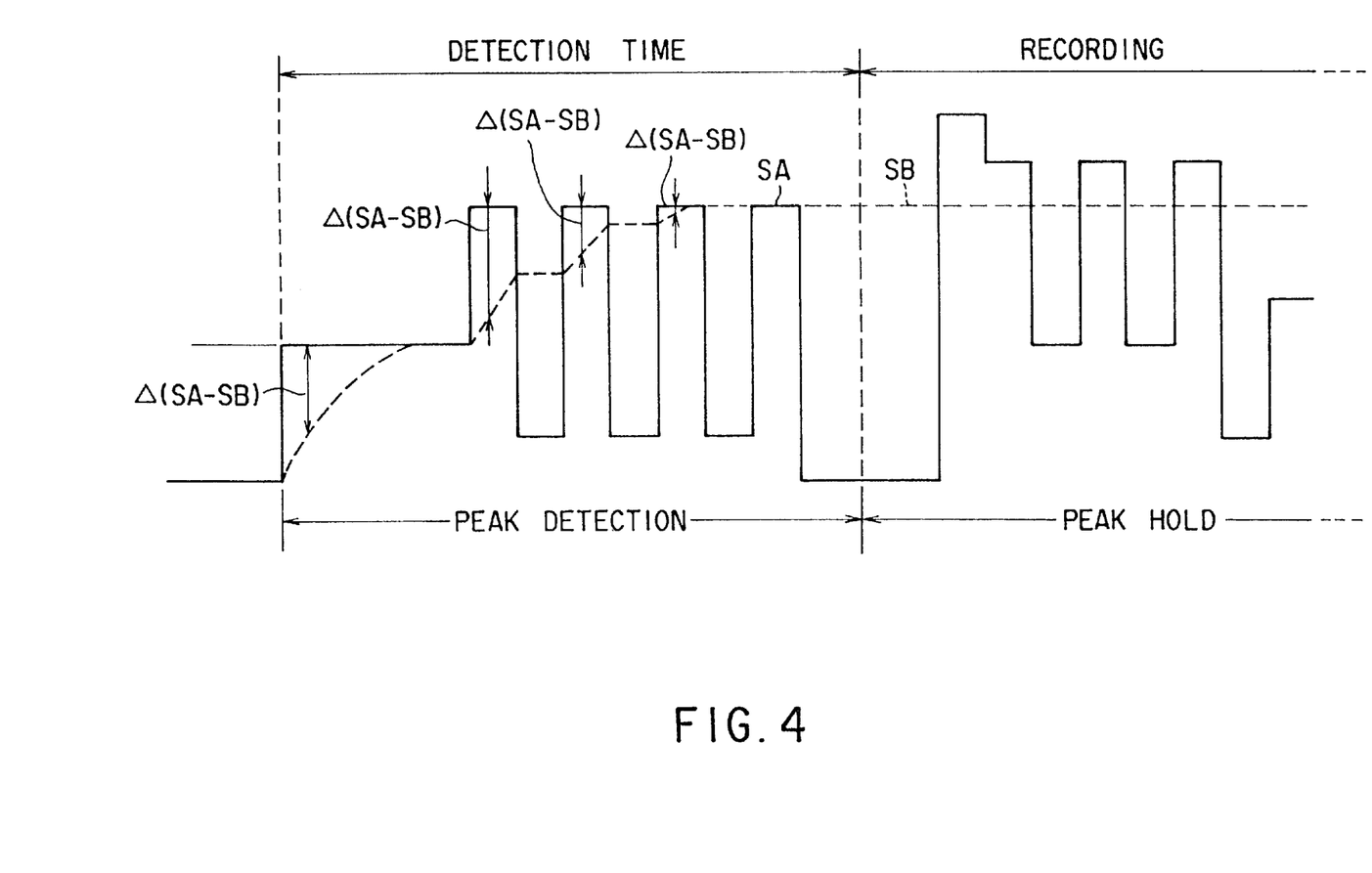
FIG. 4 is a diagram showing an waveform of an example of the operation of the peak detection circuit according to the first embodiment of the present invention.

FIG. 4 is a diagram showing a waveform which indicates an example of the operation of the peak detection circuit according to the first embodiment.

As shown in FIG. 4, in the laser output control of an optical head for optical disk, the peak level and bottom level of the laser output are detected before recording is started. This period is called detection period. During a detection period, a luminous test pulse is emitted several times. The input signal SA indicates a pulse-like waveform which follows this test pulse.

During the detection period, the peak detection circuit makes its output, that is, the peak hold signal SB, close to the peak level of the input signal SA while comparing the input signal SA with the peak detection output SP. During the peak detection operation, the damper 2 controls the current source 4 in order to reduce the charge current ICC as the potential difference Δ (SA−SB) becomes smaller.

Therefore, as shown in FIG. 4, the potential increasing rate of the peak hold signal SB becomes smaller as the peak hold signal SB becomes closer to the potential of the input signal SA, that is, the potential difference Δ (SA−SB) becomes smaller. By decreasing the potential increasing rate, charge on a hold capacitor 7 can be finished quickly at the time when the input signal SA becomes to have a level equal to or less than that of the peak hold signal SB. In this manner, such a phenomenon that the peak hold signal SB exceeds the peak level of the input signal S, is restricted. Therefore, the detection error becomes smaller than the conventional case, and therefore the accuracy of the peak detection can be improved.

It should be noted that after the detection period is finished, recording onto an optical disk is started. During the recording, the laser output is modulated to a value other than that of a test pulse light intensity, for example, a recording pulse light intensity for forming a pit in the optical disk, and the level of the input signal SA is also modulated to a value other than that of the test pulse light intensity.

During the recording, for example, the control signal SC is set at "L" level, and the peak detection operation is left stopped. Thus, the peak hold signal SB is held at the peak level of the detected input signal SA regardless of the level of the input signal SA.

Further, in this embodiment, a control signal SC is input to the gate circuit 3. The gate circuit 3 controls an output from the comparator 1 in response to the control signal SC, and turn the switch 5 off regardless of the result of the comparison made by the comparator 1. In this manner, the peak detection operation can be stopped without controlling the input signal SA. When the operation is stopped by this way, no switch noise is generated in the input signal SA since the input signal SA is not controlled. Consequently, the peak detection can be stopped without decreasing the peak detection accuracy.

It should be noted that the first embodiment was described in connection with the case where it is applied to a peak detection circuit; however the present invention can be applied to a bottom detection circuit for detecting the bottom level of a laser output.

When the invention is applied to a bottom detection circuit, it suffices only if the polarity of the current source 4 shown in FIG. 3 and the polarity of the comparator 1 are varied.

As to the case where it is applied to a bottom detection circuit, such an example of the circuit will be described in the third embodiment.

Second Embodiment

Next, a specific example of the peak detection circuit will now be described as the second embodiment of the present invention.

Figure 5:
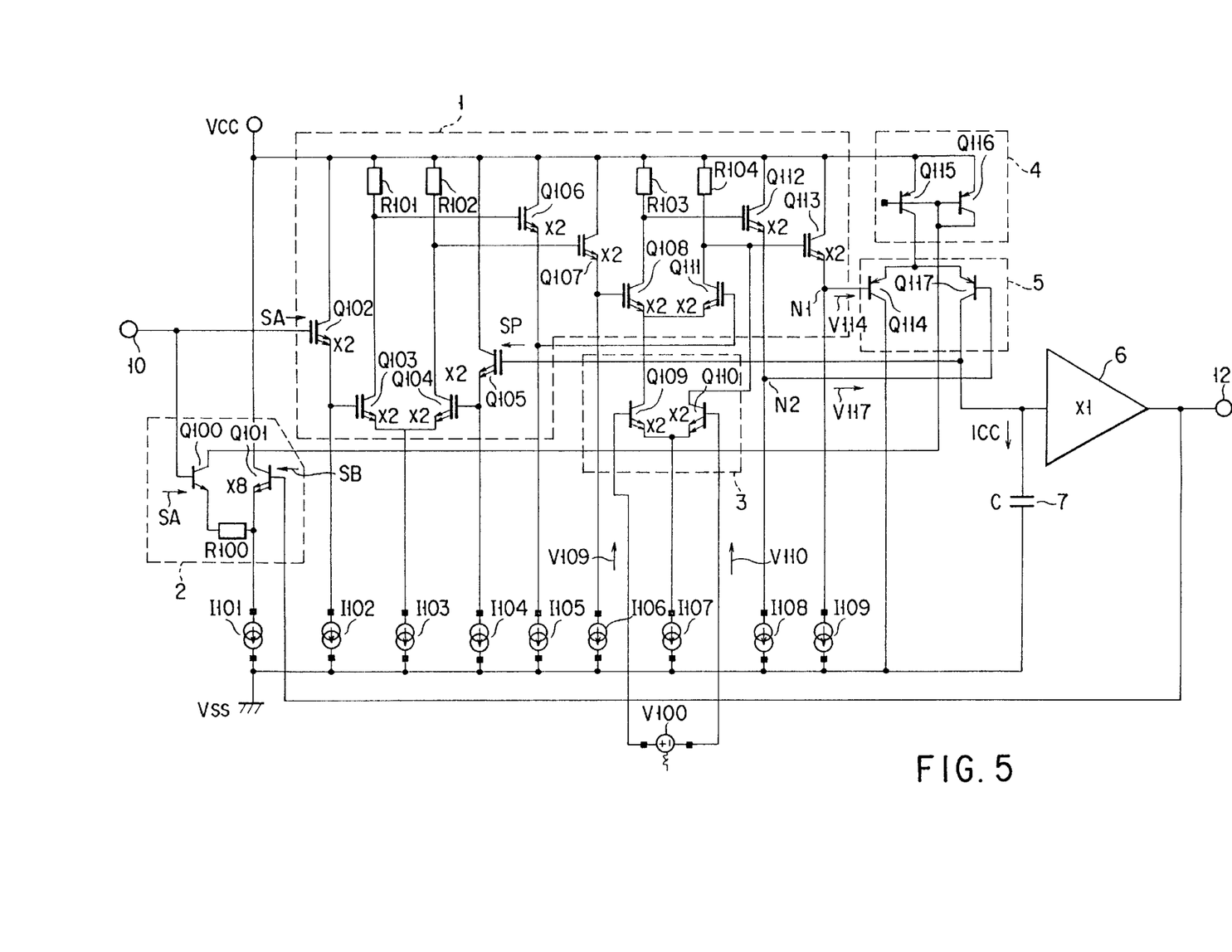
FIG. 5 is a circuit diagram showing an example of the peak detection circuit according to the second embodiment of the present invention.

FIG. 5 is a circuit diagram showing an example of the peak detection circuit according to the second embodiment of the present invention.

As shown in FIG. 5, the comparator 1 of this embodiment is a so-called non-saturation type which operates its constitutive transistor in a non-saturation region.

The advantage of using the non-saturation type comparator 1 is that the detection speed is very fast. As shown in FIG. 1, the conventional peak detection circuit has an operation amplifier 51. Conventionally, the transistor which constitutes the operation amplifier 51 is operated in a saturation region. In this operation amplifier 51, the transistor is operated in a saturation region, and therefore there is a possibility that a latch-up would occur. If a latch-up occurs, the detection speed is lowered. Further, due to the limitation of the through rate, it is difficult to perform the detection at high speed, which causes a delay in the detection. As a result, a large detection error may be caused.

By contrast, the non-saturation type comparator 1 operates the transistor in a non-saturation region. Therefore, as compared to the conventional circuit which operates its transistor in the saturation region, the detection speed is further more increased without causing a latch-up.

As shown in FIG. 5, in this example of the circuit, the non-saturation type comparator 1 consists of first to third emitter follower stages, and first and second differential amplifier stages.

The first emitter follower stage includes NPN-type transistors Q102 and Q105. Current sources I102 and I104 supply currents to the transistors Q102 and Q105. The first emitter follower stage buffers the input signal SA and peak detection output SP, and supplies them to a first differential amplifier stage.

The first differential amplifier stage includes NPN-type transistors Q103 and Q104, and resistors R101 and R102. A current source I103 supplies currents to the transistors Q103 and Q104. The first differential amplifier stage differentially amplifies the difference between the potential of the input signal SA and that of the peak detection output SP. The result of the amplification is output from the second emitter follower.

The second emitter follower stage includes NPN-type transistors Q106 and Q107. Current sources I105 and I106 supply currents to the transistors Q106 and Q107. The second emitter follower stage buffers the amplification result by the first differential amplifier stage, and supplies it to a second differential amplifier stage.

The second differential amplifier stage includes NPN-type transistors Q108 and Q111, and resistors R103 and R104. A current source I107 supplies currents to the transistors Q108 and Q111. The second differential amplifier stage further differentially amplifies the result made by amplification by the first differential amplifier stage. The amplification result is supplied to the third emitter follower stage.

The third emitter follower stage includes NPN-type transistors Q112 and Q113. Current sources I108 and I109 supply currents to the transistors Q112 and Q113. The third emitter follower stage buffers the amplification result by the second differential amplifier stage, and supplies it to a switch 5.

The switch 5 includes PNP-type transistors Q114 and Q117. A base of the transistors Q114 is connected to a connection node N1 of the transistor Q113 and the current source I109, and a base of the transistors Q117 is connected to a connection node N2 of the transistor Q112 and the current source I108.

The switch 5 is turned off when a potential V117 of the node N2 is higher than a potential V114 of the node N1 (V117>V114). Reversely, it is turned on when the potential V117 of the node N2 is lower than the potential V114 of the node N1 (V117<V114). These potentials V114 and V117 are complimentary to each other. Thus, the potentials V114 and V117 correspond to the logical signal SD described in the first embodiment.

The current source 4 contains PNP-type transistors Q115 and Q116. A base of the transistor Q115 and a base of the transistor Q116 are connected in common, so as to constitute a current mirror circuit. In this particular example of circuit, an output stage of the current mirror circuit is the transistor Q115, and this transistor Q115 supplies currents to the transistors Q114 and Q117 of the switch circuit 5. The transistor Q116 is an input stage, and its collector is connected to a damper 2.

The damper 2 includes NPN-type transistors Q100 and Q101, and a resistance R100. An input signal SA is supplied to a base of the transistor Q100, and a peak hold signal SB is supplied to a base of the transistor Q101. In this particular example of circuit, the emitter size of the transistor Q101 is 8 times as large as that of the transistor Q100. Further, the current source I101 is connected to the emitter of the transistor Q101, whereas the current source I101 is connected via the resistance R100 to the emitter of the transistor Q100. The collector of the transistor Q100 is connected to the collector of the transistor Q116 of the current source 4, and to the bases of the transistors Q115 and 116.

The damper 2 inputs an output current of the transistor Q100, to the current source 4 consisting of a current mirror circuit. With this structure, as the potential difference Δ (SA−SB) between the input signal SA and the peak hold signal SB, the current ICC supplied by the current source 4 can be lowered with accelerating speed.

Further, as in this particular example of circuit, when the emitter size ratio between the transistors Q101 and Q100, the current value of the current source I101, and the value of the resistance R100 are adjusted to optimal values respectively, a more efficient damping can be applied to the current source 4.

For example, if the potential difference Δ (SA−SB) is sufficiently large, a more amount of current ICC is supplied so as to charge the hold capacitor 7 at higher speed. When the potential difference Δ (SA−SB) becomes sufficiently small, a less amount of current is supplied so that the signal can make a more soft landing onto the peak level. In a damping operation of a better efficiency, the detection error can be made smaller while achieving the shortening of the charge time, that is, increasing the peak detection speed.

Further, this particular example includes an example of a gate circuit 3.

As shown in FIG. 5, the gate circuit 3 includes NPN-type transistors Q109 and Q110. The gate circuit 3 is a current switch circuit, and the collector of the transistor Q109 is connected to emitters of the transistors 108 and 111 of the second differential amplifier stage. These emitters are connected to the current source I107. The collector of the transistor Q110 is connected to the base of the transistor Q113 of the third emitter follower stage, and the emitter thereof is connected to the current source I107.

The gate circuit 3 supplies a current to the second differential amplifier stage when a potential V109 at the base of the transistor Q109 is higher than a potential V110 of the base of the transistor Q110 (V109>V110), so as to enable the peak detection operation. Reversely, when the potential V109 is lower than the potential V110 (V109<V110), the gate circuit 3 stops supplying a current to the second differential amplifier stage, thereby disabling the peak detection operation. At the same time, the base potential of the transistor Q113 is set to "L" level. In this manner, the potential V114 is set to "L" level, and the switch circuit 5 is turned off.

The potentials V109 and V110 are generated from the potential generating source V100 to be complementary to each other. Thus, the potentials correspond to the control signal SC described in the first embodiment.

As described above, the peak detection operation can be stopped without controlling the input signal SA by stopping the supply of a current to the second differential amplifier stage and setting the output voltage of the third emitter follower stage to such an output voltage that turns off the switch circuit 5.

Third Embodiment

Next, a specific example of the bottom detection circuit will now be described as the third embodiment of the present invention.

Figure 6:
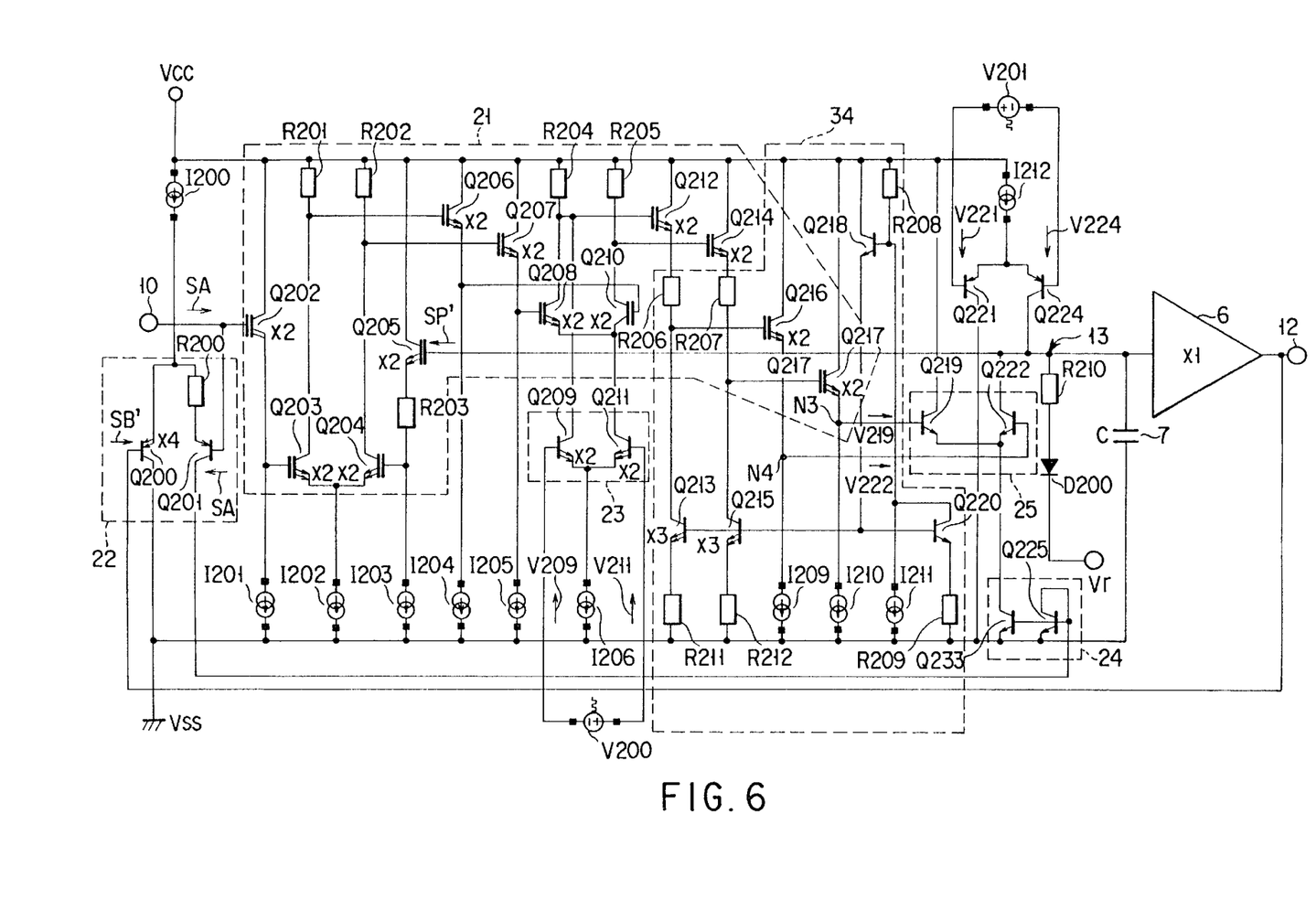
FIG. 6 is a circuit diagram showing an example of the bottom detection circuit according to the third embodiment of the present invention.

FIG. 6 is a circuit diagram showing an example of the bottom detection circuit according to the third embodiment of the present invention.

As can be seen from FIG. 6, the bottom detection circuit can be realized by substantially a similar structure to that of the peak detection circuit, except that in some block, a circuit is replaced to a type having an opposite polarity to that of the peak detection, in order to enable the bottom detection.

As shown in FIG. 6, a non-saturation type comparator 21 consists of differential amplifier stages and emitter follower stages.

The first emitter follower stage includes NPN-type transistors Q202 and Q205, and a resistor R203. A current source I201 supplies a current to the transistor Q202, and a current source I203 supplies a current via a resistance R203 to the transistor Q205. The first emitter follower stage buffers the input signal SA and bottom detection output SP', and supplies them to a first differential amplifier stage.

The first differential amplifier stage includes NPN-type transistors Q203 and Q204, and resistors R201 and R202. A current source I202 supplies currents to the transistors Q203 and Q204. The first differential amplifier stage differentially amplifies the difference between the potential of the input signal SA and that of the bottom detection output SP. The result of the amplification is output from the second emitter follower stage.

The second emitter follower stage includes NPN-type transistors Q206 and Q207. Current sources I204 and I205 supply currents to the transistors Q206 and Q207. The second emitter follower stage buffers the amplification result by the first differential amplifier stage, and supplies it to a second differential amplifier stage.

The second differential amplifier stage includes NPN-type transistors Q208 and Q210, and resistors R204 and R205. A current source I206 supplies currents to the transistors Q208 and Q210. The second differential amplifier stage further differentially amplifies the result made by amplification by the first differential amplifier stage. The amplification result is output from the third emitter follower stage.

The third emitter follower stage includes NPN-type transistors Q212 and Q214. The third emitter follower stage buffers the amplification result by the second differential amplifier stage, and supplies it to a level shift stage 34.

The level shift stage 34 includes NPN-type transistors Q213, Q215, Q216, Q217, Q218, and Q220, resistors R206, R207, R208, R209, R211 and R212, and current sources I209, I210 and I211. The level shift stage 34 shifts an output from the comparator 21 to such a level that enables the bottom detection, and supplies it to a switch 25.

The switch 25 includes NPN-type transistors Q114 and Q117. A base of the transistors Q219 is connected to a connection node N3 of the transistor Q217 and the current source I210, and a base of the transistors Q222 is connected to a connection node N4 of the transistor Q216 and the current source I209.

The switch 5 is turned off when a potential V222 of the node N4 is higher than a potential V219 of the node N3 (V222<V219). Reversely, it is turned on when the potential V222 is higher than the potential V219 (V222<V219).

The current source 24 includes NPN-type transistors Q223 and Q225. A base of the transistor Q223 and a base of the transistor Q225 are connected in common, so as to constitute a current mirror circuit. In this particular example of circuit, an output stage of the current mirror circuit is the transistor Q223, and this transistor Q223 supplies currents to the transistors Q219 and Q222 of the switch circuit 25. The transistor Q225 is an input stage, and its collector is connected to a damper 22.

The damper 22 includes PNP-type transistors Q200 and Q201, and a resistance R200. An input signal SA is supplied to a base of the transistor Q201, and a bottom hold signal SB' is supplied to a base of the transistor Q200. In this particular example of circuit, the emitter size of the transistor Q200 is 4 times as large as that of the transistor Q201. Further, the current source I200 is connected to the emitter of the transistor Q200, whereas the current source I200 is connected via the resistance R200 to the emitter of the transistor Q201. The collector of the transistor Q201 is connected to the collector of the transistor Q225 of the current source 24, and to the bases of the transistors Q223 and 225.

The damper 22 inputs an output current of the transistor Q201, to the current source 24 consisting of a current mirror circuit. With this structure, as the potential difference Δ (SB'−SA) between the input signal SA and the bottom hold signal SB', the current supplied by the current source 24 can be lowered.

Further, as in this particular example of circuit, when the emitter size ratio between the transistors Q200 and Q201, and the value of the resistance R200 are adjusted to optimal values respectively, an efficient damping can be applied to the current source 24 as in the case of the second embodiment.

A gate circuit 23 includes NPN-type transistors Q209 and Q211. The gate circuit 3 is a current switch circuit, and the collector of the transistor Q211 is connected to emitters of the transistors Q208 and Q210 of the second differential amplifier stage. These emitters are connected to the current source I206. The collector of the transistor Q209 is connected to the base of the transistor Q212 of the third emitter follower stage, and the emitter thereof is connected to the current source I206.

The gate circuit 23 supplies a current to the second differential amplifier stage when a potential V209 at the base of the transistor Q209 is lower than a potential V211 of the base of the transistor Q211 (V209<V211), so as to enable the bottom detection operation. Reversely, when the potential V209 is higher than the potential V211 (V209>V211), the gate circuit 3 stops supplying a current to the second differential amplifier stage, thereby disabling the bottom detection operation. At the same time, the base potential of the transistor Q212 is set to "L" level. In this manner, the potential V222 is set to "L" level, and the switch circuit 25 is turned off.

The potentials V209 and V211 are generated from the potential generating source V200 to be complementary to each other. Thus, the potentials V209 and V211 are control signals used for stopping the bottom detection operation.

The transistors Q221 and Q224, and the current source I212 are arranged to reset the value of the output of the bottom detection. As a current is supplied to the hold capacitor 7 upon resetting, the bottom detection output SP' is fixed to an upper limit value Vr. The upper limit value Vr is supplied to the connection node 13 via a diode D200 and a resistance R210. The diode D200 is turned on when the charge voltage on the hold capacitor 7 exceeds the upper limit value Vr. Thus, the potential at the connection node 13, that is the bottom detection output SP', is fixed to the upper limit value Vr.

It should be noted that the resetting is controlled by potentials V221 and V224 which are complimentary to each other. The potentials V221 and V224 are generated by the potential generating source V201.

In the bottom detection circuit described above, the discharge current flown from the current source 24 becomes small as the input signal SA approaches the bottom level. Therefore, the discharge from the hold capacitor 7 can be completed quickly, and therefore such a phenomenon that the level of the bottom hold signal SB' becomes lower than that of the input signal SA will not easily occur. In this manner, the detection efficiency can be improved.

Further, by inputting a control signal for stopping the bottom detection operation to the gate circuit 23, the peak detection operation can be stopped without controlling the input signal SA. When the operation is stopped by this way, no switching noise is generated in the input signal SA and therefore no switching noise is detected by the bottom detection circuit. Consequently, the bottom detection can be stopped without decreasing the peak detection accuracy.

In the above-provided description, the examples were explained in connection with the cases where NPN-type and PNP-type transistors are used; however the present invention can be easily realized with use of MOS transistors.

Fourth Embodiment

Next, an example of the structure of a laser output control system in which a peak detection circuit and a bottom detection circuit according to the present invention, will now be described as the fourth embodiment.

Figure 7:
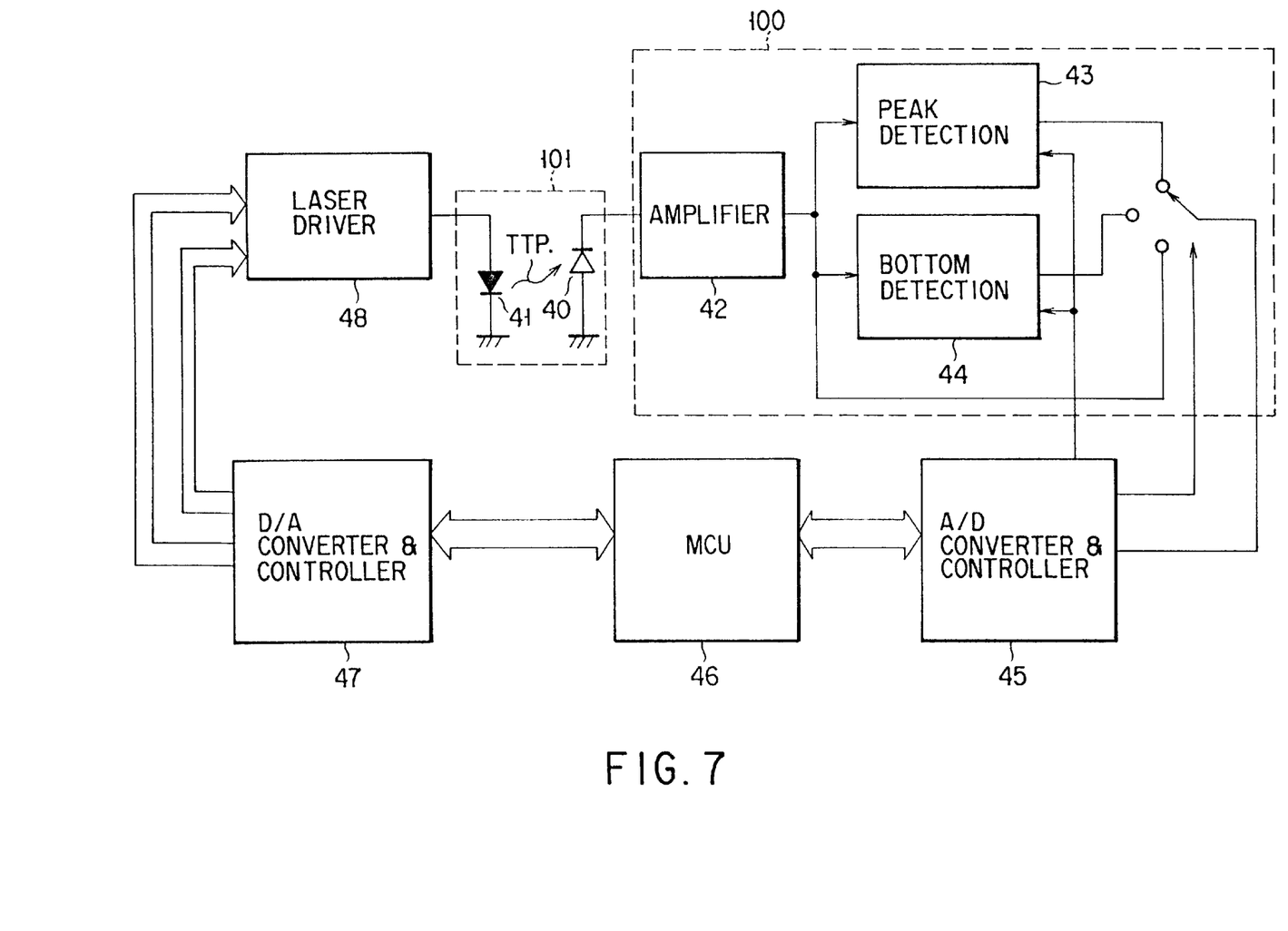
FIG. 7 is a block diagram showing an example of the structure of the laser output control system according to the fourth embodiment of the present invention.

FIG. 7 is a block diagram showing an example of the structure of the laser output control system according to the fourth embodiment of the present invention.

As shown in FIG. 7, in an optical head section 101, a light receiving element (photoelectric conversion element) 40 and a semiconductor laser 41 are provided. A specific structure of the optical head section 101 is disclosed in, for example, U.S. Pat. No. 5,250,796. The light receiving element (photoelectric conversion element) 40 converts a test pulse TTP, which is an optical signal emitted by the semiconductor laser 41, into an electric signal. Thus converted electrical signal is input to a head amplifier 100.

The head amplifier 100 includes an amplifier 42, a peak detection circuit 43 and a bottom detection circuit 44. The converted electric signal is input to the amplifier 42, where the signal is amplified. The amplifier electric signal is input to both the peak detection circuit 43 and the bottom detection circuit 44. The peak detection circuit 43 detects the peak level of the test pulse TTP, and the bottom detection circuit 44 detects the bottom level thereof. The detected peak level and bottom level, as well as a through DC level of the test pulse TTP are input to an MCU 46 via an A/D converter and controller 45.

The MCU 46 calculates out a drive current value for driving the semiconductor laser 41 with reference to the peak level, bottom level and through DC level with reference to the peak level, bottom level and through DC level. This calculation is conducted in consideration of items which vary depending on the status of the semiconductor laser 41, for example, a change in temperature and a change along with time. The result of the calculation is input as drive current value setting data for recording, to a laser driver 48 via the D/A converter and controller 47.

The laser driver 48 drives the semiconductor laser 41 with reference to input drive current value setting data.

The present invention can be applied to both the peak detection circuit 43 and the bottom detection circuit 44, built in the head amplifier 100 in such a laser output control system as shown in FIG. 7.

It should be noted that some or all of the head amplifier 100, A/D converter and controller 45, MCU 46, D/A converter and controller 47 and laser driver 48 can be integrated on one LSI chip.

As described above, according to the present invention, it is possible to provide a semiconductor integrated circuit device having peak and bottom detection circuits capable of highly accurate peak and bottom detection.

Further, it is possible with the present invention, to provide a semiconductor integrated circuit device having peak and bottom detection circuits capable of pausing a peak or bottom detection while suppressing the deterioration of the detection accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A peak/bottom level detecting circuit comprising:
a capacitor;
a current source for charging or discharging the capacitor;
a switch for connecting the current source to the capacitor;
a comparator for comparing a potential of a connection node between the switch and the capacitor, and a potential of an input signal with each other, and for turning the switch on/off in accordance with a result of the comparison;
a buffer for buffering the potential of the connection node between the switch and the capacitor, and outputting an output signal; and
a damper for damping the current source on the basis of a result of comparison between a potential of the output signal and a potential of the input signal.

2. A peak/bottom level detecting circuit according to claim 1, further comprising:
a controller for controlling an output from the comparator and turning off the switch regardless of a result of comparison of the comparator.

3. A peak/bottom level detecting circuit according to claim 2, wherein
the comparator includes:
a differential amplifier for differentially amplifying a difference between the potential of the connection node between the switch and the capacitor, and the potential of the input signal; and
a second buffer for buffering an output from the differential amplifier, and
the controller includes:
a breaker for shutting off a supply current to the differential amplifier in accordance with a control signal; and
a voltage setting member for setting an output voltage of the second buffer to a voltage for turning off the switch, in response to the control signal.

4. A peak/bottom level detecting circuit according to claim 3, wherein the differential amplifier consists of a plurality of differential amplifier stages.

5. A peak/bottom level detecting circuit according to claim 4, wherein the controller is coupled to a differential amplifier stage on a rear stage side of said plurality of differential amplifier stages, and the breaker shuts off the supply of the current to the differential amplifier stage on the rear stage side in reply to the control signal.

6. A peak/bottom level detecting circuit according to claim 3, wherein the differential amplifier is of a non-saturation type.

7. A peak/bottom level detecting circuit according to claim 1, wherein
the damper includes:
a first transistor for receiving the output signal by a base, and allowing a collector current in accordance with a potential of the output signal to flow; and
a second transistor for receiving the input signal by a base, allowing a collector current in accordance with a potential of the input signal to flow, and damping the current source by the collector current, the second transistor including an emitter connected to an emitter of the first transistor via a resistance, and having a size smaller than that of the emitter of the first transistor.

8. A peak/bottom level detecting circuit according to claim 7, wherein the current source is made of a current mirror circuit having an input stage to which a collector of the second transistor is connected, and an output stage to which the switch is connected.

9. A semiconductor integrated circuit device comprising:
an amplifier circuit for amplifying an output of an photoelectric conversion element;
a peak level detecting circuit to which an output from the amplifier circuit is input; and
a bottom level detecting circuit to which an output from the amplifier circuit is input,
wherein
the peak level detecting circuit comprises:
a capacitor;
a current source for charging or discharging the capacitor;
a switch for connecting the current source to the capacitor;
a comparator for comparing a potential of a connection node between the switch and the capacitor, and a potential of an input signal with each other, and for turning the switch on/off in accordance with a result of the comparison;
a buffer for buffering the potential of the connection node between the switch and the capacitor, and outputting an output signal; and
a damper for damping the current source on the basis of a result of comparison between a potential of the output signal and a potential of the input signal, and
the bottom level detecting circuit comprises:
a capacitor;
a current source for charging or discharging the capacitor;
a switch for connecting the current source to the capacitor;
a comparator for comparing a potential of a connection node between the switch and the capacitor, and a potential of an input signal with each other, and for turning the switch on/off in accordance with a result of the comparison;
a buffer for buffering the potential of the connection node between the switch and the capacitor, and outputting an output signal; and
a damper for damping the current source on the basis of a result of comparison between a potential of the output signal and a potential of the input signal.

10. A semiconductor integrated circuit device according to claim 9, wherein
the peak level detecting circuit further comprises:
a controller for controlling an output from the comparator and turning off the switch regardless of a result of comparison of the comparator, and
the bottom level detecting circuit further comprises:
a controller for controlling an output from the comparator and turning off the switch regardless of a result of comparison of the comparator.

11. A semiconductor integrated circuit device according to claim 10, wherein
the comparator includes:
a differential amplifier for differentially amplifying a difference between the potential of the connection node between the switch and the capacitor, and the potential of the input signal; and
a second buffer for buffering an output from the differential amplifier, and
the controller includes:

a breaker for shutting off a supply current to the differential amplifier in accordance with a control signal; and a voltage setting member for setting an output voltage of the second buffer to a voltage for turning off the switch, in response to the control signal.

12. A semiconductor integrated circuit device according to claim 11, wherein the differential amplifier consists of a plurality of differential amplifier stages.

13. A semiconductor integrated circuit device according to claim 11, wherein the differential amplifier is of a non-saturation type.

14. A semiconductor integrated circuit device according to claim 9, wherein the damper includes:
  a first transistor for receiving the output signal by a base, and allowing a collector current in accordance with a potential of the output signal to flow; and
  a second transistor for receiving the input signal by a base, allowing a collector current in accordance with a potential of the input signal to flow, and damping the current source by the collector current, the second transistor including an emitter connected to an emitter of the first transistor via a resistance, and having a size smaller than that of the emitter of the first transistor.

15. A laser output controlling device:
a laser;
a photoelectric conversion element for converting an output of the laser into an electric signal;
a head amplifier for detecting at least a peak level and a bottom level of the output of the laser, from the electric signal;
an calculator for calculating a drive current value for driving the laser with reference to the peak level and bottom level; and
a laser driver for driving the laser with reference to the drive current value;
the head amplifier including:
  an amplifier circuit for amplifying an output of the photoelectric conversion element;
  a peak level detecting circuit to which an output from the amplifier circuit is input; and
  a bottom level detecting circuit to which an output from the amplifier circuit is input,
wherein
the peak level detecting circuit comprises:
  a capacitor;
  a current source for charging or discharging the capacitor;
  a switch for connecting the current source to the capacitor;
  a comparator for comparing a potential of a connection node between the switch and the capacitor, and a potential of an input signal with each other, and for turning the switch on/off in accordance with a result of the comparison;
  a buffer for buffering the potential of the connection node between the switch and the capacitor, and outputting an output signal; and
  a damper for damping the current source on the basis of a result of comparison between a potential of the output signal and a potential of the input signal, and the bottom level detecting circuit comprises:
  a capacitor;
  a current source for charging or discharging the capacitor;
  a switch for connecting the current source to the capacitor;
  a comparator for comparing a potential of a connection node between the switch and the capacitor, and a potential of an input signal with each other, and for turning the switch on/off in accordance with a result of the comparison;
  a buffer for buffering the potential of the connection node between the switch and the capacitor, and outputting an output signal;
  a damper for damping the current source on the basis of a result of comparison between a potential of the output signal and a potential of the input signal.

16. A controlling device according to claim 15, wherein the peak level detecting circuit further comprises:
  a controller for controlling an output from the comparator and turning off the switch regardless of a result of comparison of the comparator, and the bottom level detecting circuit further comprises:
  a controller for controlling an output from the comparator and turning off the switch regardless of a result of comparison of the comparator.

17. A controlling device according to claim 16, wherein the comparator includes:
  a differential amplifier for differentially amplifying a difference between the potential of the connection node between the switch and the capacitor, and the potential of the input signal; and
  a second buffer for buffering an output from the differential amplifier, and the controller includes:
  a breaker for shutting off a supply current to the differential amplifier in accordance with a control signal; and
  a voltage setting member for setting an output voltage of the second buffer to a voltage for turning off the switch, in response to the control signal.

18. A controlling device according to claim 17, wherein the differential amplifier consists of a plurality of differential amplifier stages.

19. A controlling device according to claim 17, wherein the differential amplifier is of a non-saturation type.

20. A controlling device according to claim 15, wherein the damper includes:
  a first transistor for receiving the output signal by a base, and allowing a collector current in accordance with a potential of the output signal to flow; and
  a second transistor for receiving the input signal by a base, allowing a collector current in accordance with a potential of the input signal to flow, and damping the current source by the collector current, the second transistor including an emitter connected to an emitter of the first transistor via a resistance, and having a size smaller than that of the emitter of the first transistor.

* * * * *